United States Patent
Eggers (10) Patent No.: US 11,327,133 B2
(45) Date of Patent: May 10, 2022

(54) DIXON-TYPE WATER/FAT SEPARATION MR IMAGING

(71) Applicant: KONINKLIJKE PHILIPS N.V., Eindhoven (NL)

(72) Inventor: Holger Eggers, Ellerhoop (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/640,382

(22) PCT Filed: Aug. 17, 2018

(86) PCT No.: PCT/EP2018/072295
§ 371 (c)(1),
(2) Date: Feb. 20, 2020

(87) PCT Pub. No.: WO2019/038192
PCT Pub. Date: Feb. 28, 2019

(65) Prior Publication Data
US 2020/0355772 A1    Nov. 12, 2020

Related U.S. Application Data

(60) Provisional application No. 62/644,714, filed on Mar. 19, 2018.

(30) Foreign Application Priority Data

Aug. 24, 2017    (EP) .................................... 17187711

(51) Int. Cl.
*G01V 3/00*         (2006.01)
*G01R 33/48*        (2006.01)
(Continued)

(52) U.S. Cl.
CPC ..... *G01R 33/4828* (2013.01); *G01R 33/5616* (2013.01); *G01R 33/56554* (2013.01); *G01R 33/56563* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

2005/0033153 A1*  2/2005  Moriguchi ........... G01R 33/565
                                                                600/410
2009/0072826 A1*  3/2009  Hargreaves ........ G01R 33/4828
                                                                324/309
(Continued)

OTHER PUBLICATIONS

Lu W, et al. "Water-fat separation with bipolar multi-echo sequences". Magn Reson Med 2008; 60:198-209.
(Continued)

*Primary Examiner* — Walter L Lindsay, Jr.
*Assistant Examiner* — Frederick Wenderoth (57) ABSTRACT

The invention relates to a method of Dixon-type MR imaging. It is an object of the invention to provide a method that enables efficient and reliable water/fat separation. The method of the invention comprises the following steps: subjecting an object (10) to an imaging sequence, which comprises at least one excitation RF pulse and switched magnetic field gradients, wherein two echo signals, a first echo signal and a second echo signal, are generated at different echo times (TE1, TE2), acquiring the echo signals from the object (10), reconstructing a water image and/or a fat image from the echo signals, wherein contributions from water and fat to the echo signals are separated using a two-point Dixon technique in a first region of k-space and a single-point Dixon technique in a second region of k-space, wherein the first region is different from the second region.

(Continued)

In other words, the invention proposes an adaptive switching between a two-point Dixon technique for water/separation, applied to both the first and second echo signals, and a single-point Dixon technique applied to one of the two echo signals, i.e. the first echo signal data or the second echo signal data, depending on the position in k-space. Moreover, the invention relates to a MR device (1) and to a computer program to be run on a MR device (1).

22 Claims, 3 Drawing Sheets

(51) Int. Cl.
  *G01R 33/561* (2006.01)
  *G01R 33/565* (2006.01)
(58) Field of Classification Search
  USPC .......................................... 324/309
  See application file for complete search history.

(56) References Cited

U.S. PATENT DOCUMENTS

| | | | |
|---|---|---|---|
| 2013/0089271 A1* | 4/2013 | Boernert | G01N 24/08 382/274 |
| 2013/0214781 A1* | 8/2013 | Hernando | G01R 33/4828 324/309 |
| 2015/0061672 A1 | 3/2015 | Kannengiesser et al. | |
| 2015/0161784 A1* | 6/2015 | Ma | G06T 7/0012 382/131 |
| 2015/0212183 A1* | 7/2015 | Beck | G01R 33/482 324/309 |
| 2016/0232663 A1 | 8/2016 | Nickel | |
| 2017/0097400 A1 | 4/2017 | Nakai | |
| 2018/0098711 A1 | 4/2018 | Leporq et al. | |

OTHER PUBLICATIONS

Eggers H, et al. "Dual-echo Dixon imaging with flexible choice of echo times". Magn Reson Med 2011; 65:96-107.

Pernilla Peterson et al., "Fat Quantification Using Multiecho Sequences with Bipolar Gradients: Investigation of Accuracy and Noise Performance" Magnetic Resonance in Med. 71 p. 219-229 (2014).

Abraam S. Soliman et al., "Fat Quantification Using an Interleaved Bipolar Acquisition" Magnetic Resonance in Med. 75 p. 2000-2008 (2016).

International Search Report and Written Opinion from PCT/EP2018/072295 dated Nov. 28, 2018.

Ma et al "A Single Point Dixon Technique for Fat-Suppressed Fast 3D Gradient Echo Imaging with Flexible Echo Time" Journal of Magnetic Resonance, vol. 27, No. 4, p. 881-890 Feb. 26, 2008.

Eggers "Fat Shift Correction in Bipolar Multi-Echo Dixon Imaging using Water Fat Separation in k-space" Proceedings of the International Soc. for Magnetic Resonance in Med. vol. 26, p. 4217 (Jun. 1, 2018).

Altback et al "Chemical Shift Imaging Utilizing the Positional Shifts Along the Readout Gradient Direction" IEEE Transactions on Medical Imaging vol. 20, No. 11, Nov. 1, 2001.

Geppert et al "Three Images From Two Echos: Reconstruction of Water, Fat and Silicon Images Using a Combined One-Point and Two Point Dixon Approach" Proc. Intl. Soc. Mag. Reson. Med 17 p. 2105 (2009).

* cited by examiner

DIXON-TYPE WATER/FAT SEPARATION MR IMAGING

CROSS REFERENCE TO RELATED APPLICATIONS

This application is a U.S. national phase application of International Application No. PCT/EP2018/072295 filed on Aug. 17, 2018, which claims the benefit of EP Application Serial No. 17187711.1 filed on Aug. 24, 2017 and U.S. Provisional Application Ser. No. 62/644,714 filed on Mar. 19, 2018, both of which are incorporated herein by reference.

FIELD OF THE INVENTION

The invention relates to the field of magnetic resonance (MR) imaging. It concerns a method of MR imaging of an object placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z-axis to the transverse plane (flip angle 90°).

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each k-space line is digitized by collecting a number of samples. A set of k-space data is converted to an MR image, e.g., by means of Fourier transformation.

In MR imaging, it is often desired to obtain information about the relative contribution of water and fat to the overall signal, either to suppress the contribution of one of them or to separately or jointly analyze the contribution of both of them. These contributions can be calculated if information from two or more corresponding echoes, acquired at different echo times, is combined. This may be considered as chemical shift encoding, in which an additional dimension, the chemical shift dimension, is defined and encoded by acquiring two or more MR images at slightly different echo times. For water/fat separation, these types of experiments are often referred to as Dixon-type of measurements. By means of Dixon MR imaging or Dixon water/fat MR imaging, a water/fat separation is achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of the 'in-phase' and 'out-of-phase' datasets.

Several Dixon-type MR imaging methods have been proposed in recent years. Apart from different strategies for the water/fat separation, the known techniques are mainly characterized by the specific number of echoes (or 'points') they acquire and by the constraints that they impose on the used echo times. Conventional so-called two- and three-point methods require in-phase and opposed-phase echo times at which the water and fat signals are parallel and antiparallel in the complex plane, respectively. Three-point methods have gradually been generalized to allow flexible echo times. Thus, they do not restrict the angle or phase between the water and fat signals at the echo times to certain values anymore. In this way, they provide more freedom in imaging sequence design and enable in particular a trade-off between signal-to-noise ratio (SNR) gains from the acquisition and SNR losses in the separation. On the other hand, sampling only two instead of three echoes is desirable to reduce scan time. Eggers et al. (Magn. Reson. Med., 65:96-107, 2011) have proposed a dual-echo flexible Dixon-type MR imaging method. Using such Dixon-type MR imaging methods with flexible echo times, in-phase and opposed-phase images are no longer necessarily acquired, but optionally synthesized from water and fat images.

Various strategies can be used in Dixon imaging for acquiring echo signals at two different echo times, including: (i) dual-pass strategies, wherein each echo signal is acquired separately after an excitation RF pulse using a positive amplitude readout magnetic field gradient, (ii) fly-back strategies, wherein both echo signals are acquired after the same excitation RF pulse using a positive amplitude readout magnetic field gradient in combination with a negative amplitude re-winder magnetic field gradient, and (iii) bipolar strategies, wherein both echo signals are acquired after the same excitation RF pulse, one echo being acquired using a positive amplitude readout magnetic field gradient and the other echo being acquired using a negative amplitude readout magnetic field gradient.

Bipolar strategies offer many attractive advantages, such as shorter scan times, higher SNR (signal-to-noise ratio) efficiency, a more robust field map estimation, reduced motion-induced artifacts, and less sensitivity to short $T_2^*$. However, the alternating readout magnetic field gradients cause several problems, including delay effects and image misregistrations, which limit the direct application of existing Dixon water/fat separation techniques. Lu et al. ("Water-fat separation with bipolar multi-echo sequences", Magn. Reson. Med. 2008, 60, 198-209) propose to apply a post-processing of the acquired echo signals prior to water/fat separation. This post-processing includes shifting the k-space data to correct for k-space echo misalignments and warping the images based on a low-resolution field map to remove field-inhomogeneity-induced misregistration. The actual water/fat separation is then performed in k-space, whereby chemical shift-induced artifacts in the separated water and fat images are eliminated.

Corresponding to the selected echo times, the inverse problem of the Dixon technique applied for water/fat separation is usually well-conditioned in the central portion of k-space. Due to the finite sampling rate, however, the inverse problem may be ill-conditioned in the more peripheral portions of k-space. To this end, Lu et al. further propose a regularization by diagonal loading to prevent excessive noise amplification in these k-space areas. However, this approach introduces a bias in the estimation of the water and fat signal contributions.

It is thus an object of the invention to provide a method that enables efficient and reliable Dixon water/fat separation using multi-echo acquisition techniques, such as dual echo TSE or dual echo GRASE acquisition or bipolar acquisition strategies.

SUMMARY OF THE INVENTION

In accordance with the invention, a method of MR imaging of an object (e.g. the body of a patient) placed in an examination volume of a MR device is disclosed. The method comprises the following steps:

subjecting the object to an imaging sequence, which comprises at least one excitation RF pulse and switched magnetic field gradients, wherein two echo signals, a first echo signal and a second echo signal, are generated at different echo times, acquiring the echo signals from the object, and reconstructing a water image and/or a fat image from the echo signals, wherein contributions from water and fat to the echo signals are separated using a two-point Dixon technique in a first region of k-space and a single-point Dixon technique in a second region of k-space, wherein the first region is different from the second region.

The invention proposes an adaptive switching between a two-point Dixon technique for water/separation, applied to both the first and second echo signals, and a single-point Dixon technique applied to one of the two echo signals, i.e. the first echo signal data or the second echo signal data, depending on the position in k-space. Alternatively, the single-point Dixon technique may be applied to both echoes individually and the results may then be combined to reduce noise.

Preferably, two echo signals are acquired using bipolar readout magnetic field gradients according to the invention. The two echo signals are acquired using a pair of temporally adjoining readout magnetic field gradients having opposed polarities. The first echo is acquired at a first echo time using a positive amplitude readout magnetic field gradient and the second echo is acquired at a second echo time using a negative amplitude readout magnetic field gradient (or vice versa).

Because of the delay effects and image misregistrations occurring with bipolar acquisitions, the two echo signals are preferably corrected for k-space misalignments prior to reconstructing the water and fat images. The two echo signals should further be corrected for phase errors and image space misalignments due to main field inhomogeneity prior to reconstructing the water and fat images. With regard to the details of these correction steps and with regard to performing the water/fat separation in k-space reference is made to the article by Lu et al. cited above.

As mentioned before, the imaging parameters will usually be selected such that the inverse problem of the two-point Dixon technique applied for water/fat separation is well-conditioned in the central portion of k-space. However, with the same imaging parameters, the inverse problem of the two-point Dixon separation may be ill-conditioned in the more peripheral portions of k-space. Therefore, the first k-space region, in which the two-point Dixon technique is applied, should be determined to cover the central portion of k-space (where the corresponding inverse problem is well-conditioned). It is an insight of the invention that, while the two-point Dixon technique becomes ill-conditioned, in this example towards the periphery of k-space, the inverse problem of a single-point Dixon technique applied to the first and/or second echo signal data becomes (or remains) sufficiently well-conditioned. Hence, the second k-space region, where the single-point Dixon technique is applied, is preferably determined to cover a peripheral portion of k-space according to the invention.

In general, the invention proposes to determine the first and second k-space regions according to the predicted conditioning of the inverse problems of the two-point and single point Dixon techniques in the respective k-space regions. The predicted water/fat biasing of the respective Dixon separation technique may also be taken into account. Finally, a water image and/or a fat image are reconstructed using the k-space data after the separation of water and fat contributions.

According to a preferred embodiment of the invention, the contributions from water and fat are assumed to be Hermitian in k-space in those k-space regions in which the inverse problem of the respective two-point or single-point Dixon technique is ill-conditioned. As mentioned before, the conditioning of the inverse problem of the Dixon technique can be improved by regularization. However, this regularization introduces a bias in the estimation of the water and fat signal contributions. It is an insight of the invention, that the conditioning of the inverse problem can be improved (without biasing the estimation of the water and fat contribution by regularization) by constraining the initial phase of the water and fat signal contributions in image space to be equal whenever the (unconstrained) inverse problem is ill-conditioned. The water and fat signal contributions are then assumed to be real in image space, and thus to be Hermitian in k-space. The conditioning of the inverse problem can be determined by the noise amplification of the respective water/fat separation algorithm. The inverse problem can be regarded as ill-conditioned, e.g., if the level of noise amplification is above a given threshold.

The approach of the invention, in which the Dixon algorithm assumes that the signal contributions from water and fat are Hermitian in k-space, provides a single-point and a two-point water/fat separation in k-space, which operates on the two echo signals. It can be employed locally for selected k-space regions (according to the conditioning of the respective inverse problem) or even globally for all k-space regions. Unlike the common complex water/fat separation, it often remains well-conditioned without regularization.

The method of the invention described thus far can be carried out by means of a MR device including at least one main magnet coil for generating an essentially uniform, static magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
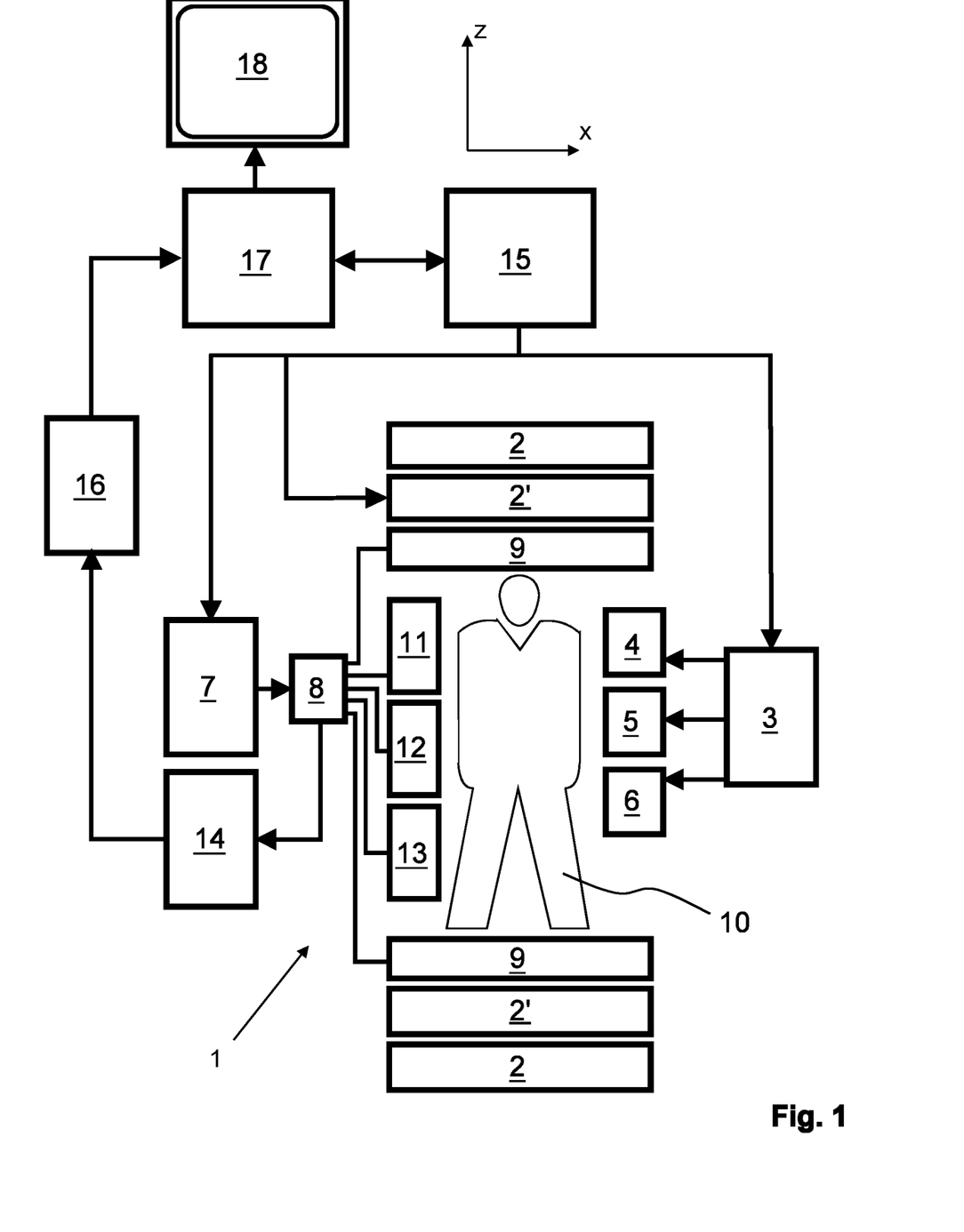
FIG. 1 shows a MR device for carrying out the method of the invention.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$ and—where applicable—$3^{rd}$ order) shimming coils 2', wherein the current flow through the individual shimming coils of the set of shimming coils 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate resonance, excite resonance, invert magnetization, refocus resonance, or manipulate resonance and select a portion of a body 10 positioned in the examination volume. The MR signals are also picked up by the body RF coil 9.

For generation of MR images of limited regions of the body 10, a set of local array RF coils 11, 12, 13 are placed contiguous to the region selected for imaging. The array coils 11, 12, 13 can be used to receive MR signals induced by RF transmissions via the body RF coil.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via the send/receive switch 8.

A host computer 15 controls the shimming coils 2' as well as the gradient pulse amplifier 3 and the digital RF frequency transmitter 7 to generate the imaging sequences of the invention. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 and the reconstruction processor 17 are programmed to execute the method of the invention as described above and in the following.

Figure 2:
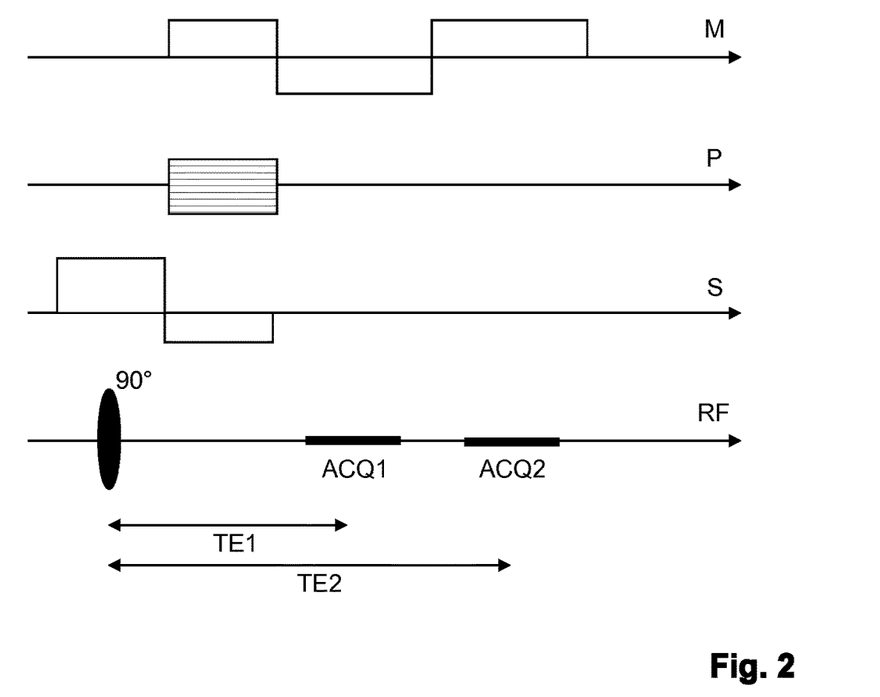
FIG. 2 shows a schematic (simplified) pulse sequence diagram of a Dixon imaging sequence using bipolar readout magnetic field gradients according to the invention.

In FIG. 2, a schematic pulse sequence diagram of a Dixon imaging sequence using bipolar readout magnetic field gradients according to the invention is depicted. The diagram shows switched magnetic field gradients in the frequencyencoding direction (M), the phase-encoding direction (P) and the slice-selection direction (S). Moreover, the diagram shows an RF excitation pulse as well as the time intervals during which echo signals are acquired, designated by ACQ1 and ACQ2. The diagram covers the acquisition of one pair of echo signals. A number of such pairs of echo signals is acquired by multiple repetitions of the depicted sequence using different phase encodings (P) to completely cover the required region of k-space. Each pair of echo signals is acquired using a corresponding pair of readout magnetic field gradients (M) having opposed polarities. The timing and amplitudes of the bipolar readout gradients are chosen to shift the acquisition windows ACQ1. ACQ2 of the echo signals such that different echo times TE1 and TE2 and correspondingly different phase offsets of the signal contributions from water protons and fat protons are provided. The Dixon-type separation of these signal contributions is based on these phase offsets in the final step of reconstruction of a water and/or a fat image.

Prior to reconstruction, the two echo signals are corrected for k-space misalignments and for phase errors as well as for image space misalignments due to main field inhomogeneity (see, e.g., Lu et al., "Water-fat separation with bipolar multi-echo sequences", Magn. Reson. Med. 2008, 60, 198-209).

The following reconstruction involves a separation of contributions from water and fat to the echo signals in k-space. To this end, a two-point Dixon technique (see, e.g., Eggers et al., "Dual-echo Dixon imaging with flexible choice of echo times", Magn. Reson. Med. 2011, 65, 96-107) is applied in a first region of k-space and a single-point Dixon technique (see, e.g., Ma, "A single-point Dixon technique for fat-suppressed fast 3D gradient-echo imaging with a flexible echo time", J. Magn. Reson. Imaging 2008, 27, 881-890) is applied in a second region of k-space. The single-point Dixon technique may be applied to one of the two echo signals, i.e. the first echo signal data or the second echo signal data. Alternatively, the single-point Dixon technique may be applied to both echoes individually and the results may then be combined to reduce noise.

Unlike the two-point Dixon technique, the single-point Dixon technique models the water and fat signals in image space as real variables. In k-space, this corresponds to conjugate symmetric water and fat signals. To exploit this property, the water/fat separation is advantageously performed in k-space jointly for corresponding negative and positive frequencies. Alternatively, the echo signals in k-space to which the single-point Dixon technique is to be applied may be transformed to image space for the water/fat separation, because the fat shift is unipolar in the individual echo signal data and may simply be corrected after the water/fat separation.

Figure 3:
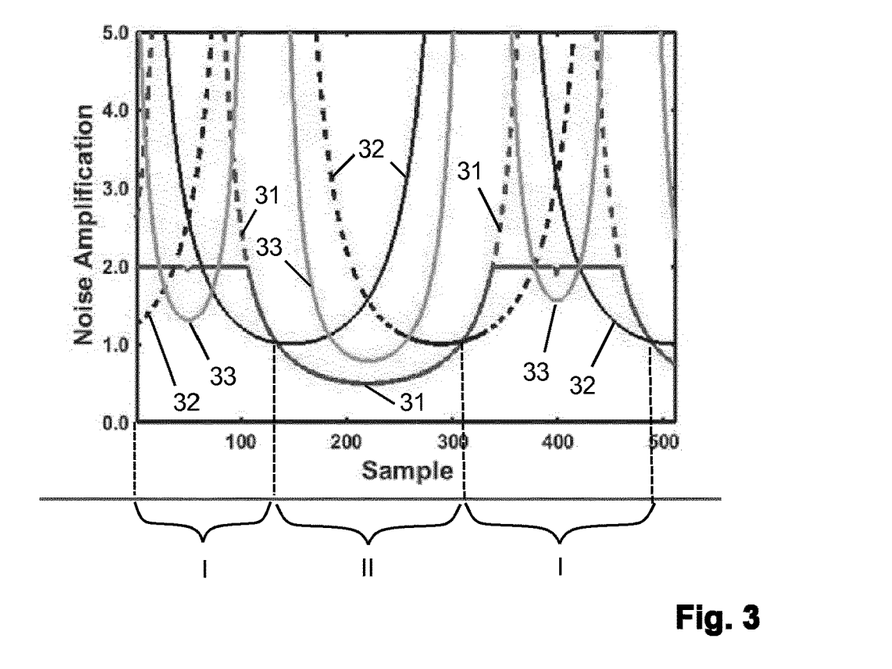
FIG. 3 shows a diagram illustrating the noise amplification by the Dixon water/fat separation in k-space as a function of the k-space position.

The invention proposes to determine the first and second k-space regions according to the predicted conditioning of the inverse problems of the two-point and single point Dixon techniques in the respective k-space regions. This is illustrated in FIG. 3. The diagram shows the noise amplification by the respective water/fat separation algorithm in k-space as function of the k-space position (sample number), once using a two-point Dixon technique without (dashed part of curve 31) and with (solid part of curve 31) adaptive regularization, as in the above-cited article by Lu et al., and once applying a single-point Dixon technique to the first echo (solid curve 32), the second echo (dashed curve 32), and to both individually and averaging of the results (curve 33). A Dixon turbo spin echo (TSE) sequence with echo shifts of −0.5 ms and 1.5 ms at 1.5 T and a partial echo factor of 0.75 was assumed in this example. Near the center of k-space (sample number 256), the noise amplification of the employed two-point Dixon technique is close to the optimum of 0.5, which corresponds to a two-fold averaging. Toward the periphery of k-space, however, the noise amplification increases dramatically (unless regularization is applied). As indicated by solid curve 31, the noise amplification is limited to a maximum of 2.0 in this example. However, this regularization introduces a bias in the estimation of the water and fat signal contributions. While the noise amplification becomes unfavorable toward the periphery of k-space for the two-point Dixon technique (indicating the inverse problem becoming ill-conditioned), it becomes more favorable for the single-point Dixon technique applied to the first or the second echo. This is evident from curves 32, 33. Wherever one of the two curves 32, 33 remains below curve 31, it is advantageous to rely on the single-point Dixon technique instead of the two-point Dixon technique. This characterizes the second k-space region within the meaning of the invention. The central k-space region, where the noise amplification is minimum along curve 31, forms the first k-space region within the meaning of the invention. At certain k-space positions (also within the second region), an averaging of the results of the single-point Dixon technique applied individually to the first and the second echo signal data provides a further reduction in noise amplification.

Finally, a water image and/or a fat image is reconstructed using the k-space data after the afore-described separation of water and fat contributions.

The two complex echo signals $S_1$ and $S_2$ (after estimation and demodulation of the main field inhomogeneity-induced phase) can be modelled by $$\begin{bmatrix} S_{1k} \\ S_{2k} \end{bmatrix} = \begin{bmatrix} 1 & c_{1k} \\ 1 & c_{2k} \end{bmatrix} \begin{bmatrix} W_k \\ F_k \end{bmatrix},$$

With $$c_k = \Sigma_n w_n e^{2\pi i \Delta f_n t_k},$$

where W and F denote the water and fat signal in k-space, t the acquisition time, and w and $\Delta f$ the relative amplitude and frequency of the peaks of the employed spectral model of fat. A solution for W and F is given by $$\begin{bmatrix} W_k \\ F_k \end{bmatrix} = (C_k^H C_k + \lambda I)^{-1} C_k^H \begin{bmatrix} S_{1k} \\ S_{2k} \end{bmatrix},$$

With $$C_k = \begin{bmatrix} 1 & c_{1k} \\ 1 & c_{2k} \end{bmatrix},$$

where $\lambda$ denotes a regularization parameter.

Figure 4:
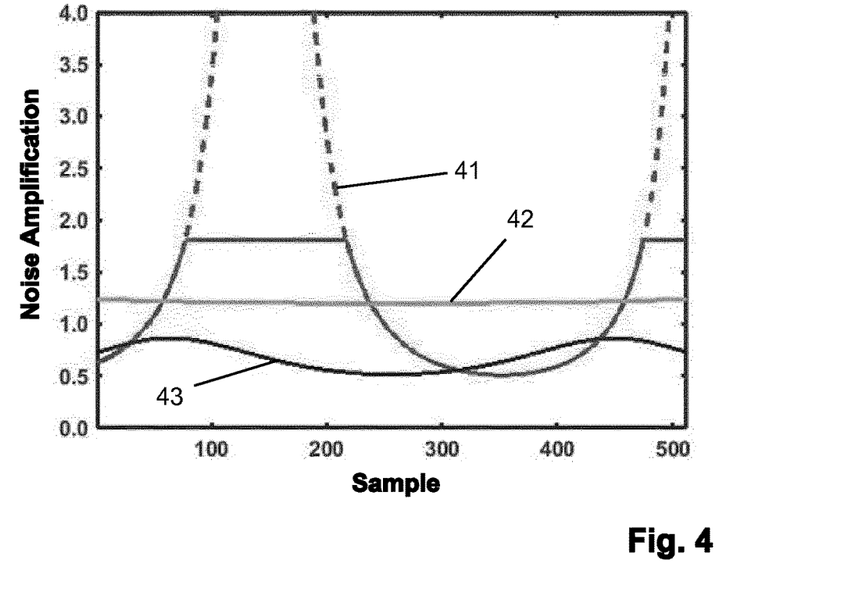
FIG. 4 is an exemplary diagram illustrating aspects of the present invention.

As explained above with reference to FIGS. 1-3, a suitable choice of $\lambda$ allows to limit the noise amplification factor to a desired value. However, the diagonal loading of the matrix $C^H C$ introduces a bias into the water/fat separation. In order to avoid this, the invention suggests to constrain the initial phase of the water and fat signal in image space to be equal if the inversion of the matrix $C^H C$ is ill-conditioned. The water and fat signal contributions are then assumed to be real in image space, and thus to be Hermitian in k-space. Considering one echo only, S is described by $$\begin{bmatrix} S_{k_1 R} \\ S_{k_1 I} \\ S_{k_2 R} \\ S_{k_2 I} \end{bmatrix} = \begin{bmatrix} 1 & 0 & c_{k_1 R} & -c_{k_1 I} \\ 0 & 1 & c_{k_1 I} & c_{k_1 R} \\ 1 & 0 & c_{k_2 R} & c_{k_2 I} \\ 0 & -1 & c_{k_2 I} & -c_{k_2 R} \end{bmatrix} \begin{bmatrix} W_{k_1 R} \\ W_{k_1 I} \\ F_{k_1 R} \\ F_{k_1 I} \end{bmatrix},$$

where the subscripts $_R$ and $_I$ denote the real and imaginary parts, and $k_2=-k_1$. Including the second echo as well leads to $$\begin{bmatrix} S_{1k_1 R} \\ S_{1k_1 I} \\ S_{1k_2 R} \\ S_{1k_2 I} \\ S_{1k_2 R} \\ S_{2k_2 I} \\ S_{2k_2 R} \\ S_{2k_2 I} \end{bmatrix} = \begin{bmatrix} 1 & 0 & c_{1k_1 R} & -c_{1k_1 I} \\ 0 & 1 & c_{1k_1 I} & c_{1k_1 R} \\ 1 & 0 & c_{1k_2 R} & c_{1k_2 I} \\ 0 & -1 & c_{1k_2 I} & -c_{1k_2 R} \\ 1 & 0 & c_{2k_1 R} & -c_{2k_1 I} \\ 0 & 1 & c_{2k_1 I} & c_{2k_1 R} \\ 1 & 0 & c_{2k_2 R} & c_{2k_2 I} \\ 0 & -1 & c_{2k_2 I} & -c_{2k_2 R} \end{bmatrix} \begin{bmatrix} W_{k_1 R} \\ W_{k_1 I} \\ F_{k_1 R} \\ F_{k_1 I} \end{bmatrix},$$

which constitutes an overdetermined linear system of eight equations. W and F are, in both cases, derived as above, but without regularization. This constrained Dixon technique provides a one-point and a two-point water/fat separation in k-space, which operates on pairs of k-space samples. It can be employed locally for selected k-space regions or globally for all k-space regions. As a measure for the conditioning of the inverse problem, the diagram of FIG. 4 shows the noise amplification by the respective water/fat separation algorithm in k-space as function of the k-space position (sample number), once using a conventional complex two-point Dixon technique without (dashed part of curve 41) and with (solid part of curve 41) regularization, and using the proposed constrained water/fat separation without regularization, considering only the first echo (curve 42) and both echoes (curve 43). As can be seen from FIG. 4, unlike the conventional complex separation (curve 41), the separation constrained to real-valued water and fat signal contributions (curves 42, 43) remains well-conditioned without regularization. Its noise amplification exhibits only minor variations across k-space and stays within reasonable bounds.

Figure 5:
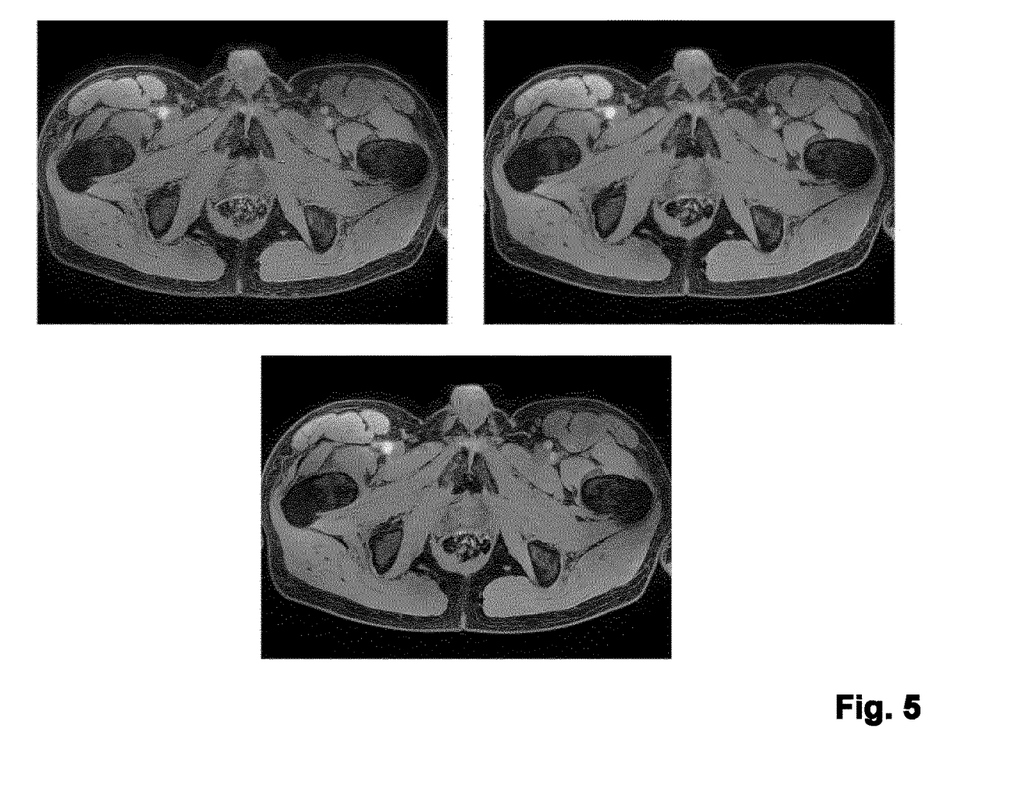
FIG. 5 shows exemplary images in accordance with aspects of the present invention.

Finally, the proposed constrained Dixon water/fat separation is demonstrated exemplarily with reference to FIG. 5. The pelvis of a volunteer was imaged with a 3D $T_1$-weighted spoiled dual-gradient-echo sequence on a 3 Tesla MR device. A field of view of 350 (AP)×350 (RL)×200 (FH) mm³, a resolution of 0.7×0.7×2.5 mm³, a $TE_1/TE_2$/TR of 2.0/3.7/5.5 ms, and a flip angle of 10° were chosen. The pixel bandwidth amounted to 650 Hz, corresponding to a shift of the signal from the dominant peak of the fat spectrum of 0.65 pixel in the single-echo images. The main field inhomogeneity-induced phase and the initial phase of the water and fat signals were first determined and eliminated from the single-echo images, ignoring any misregistration. The complex separation according to a conventional Dixon algorithm, without and with regularization, as well as the proposed 'hybrid complex-real' constrained separation without regularization were then applied in k-space. Results for a single slice are shown FIG. 5. FIG. 5 shows water images reconstructed using conventional complex Dixon water/fat separation (top row), without (left) and with (right) regularization, and using the proposed hybrid complex-real separation (bottom) without regularization. While regularization is essential in the conventional complex separation to prevent high frequency noise from breaking through, it is evidently unnecessary with the approach proposed by the invention. The loss of image sharpness observed conventionally as an adverse effect of regularization can be avoided by the method of the invention without suffering from excessive noise amplification.

The invention claimed is:

1. A method of magnetic resonance (MR) imaging of an object placed in an examination volume of a MR device, the method comprising the steps of:
   subjecting the object to an imaging sequence, which comprises at least one excitation RF pulse and switched magnetic field gradients, wherein two echo signals, a first echo signal and a second echo signal, are generated at different echo times (TE1, TE2),
   acquiring the echo signals from the object,
   reconstructing a water image and/or a fat image from the echo signals, wherein: contributions from water and fat to the echo signals are separated using a two-point Dixon technique in a first region of k-space and a single-point Dixon technique in a second region of k-space; and the two-point Dixon technique and/or the single-point Dixon technique are applied without regularization.

2. A method of magnetic resonance (MR) imaging of an object placed in an examination volume of a MR device, the method comprising:
   subjecting the object to an imaging sequence, which comprises at least one excitation RF pulse and switched magnetic field gradients, wherein two echo signals, a first echo signal and a second echo signal, are generated at different echo times (TE1, TE2);
   acquiring the echo signals from the object; and
   reconstructing a water image and/or a fat image from the echo signals, wherein contributions from water and fat to the echo signals are separated using a two-point Dixon technique and/or a single-point Dixon technique, wherein the contributions from water and fat are assumed to be Hermitian in k-space in those k-space regions in which an inverse problem of the respective two-point or single-point Dixon technique is ill-conditioned.

3. A tangible, non-transitory computer readable medium that stores instructions, which when executed by a processor, causes the processor to:
   subject an object to a magnetic resonance (MR) imaging sequence, which comprises at least one excitation RF pulse and switched magnetic field gradients, wherein two echo signals, a first echo signal and a second echo signal, are generated at different echo times (TE1, TE2);
   acquire the echo signals from the object; and
   reconstruct a water image and/or a fat image from the echo signals, wherein: contributions from water and fat to the echo signals are separated using a two-point Dixon technique in a first region of k-space and a single-point Dixon technique in a second region of k-space; and the two-point Dixon technique and/or the single-point Dixon technique are applied without regularization.

4. The method of claim 1, wherein the two echo signals are acquired using bipolar readout magnetic field gradients.

5. The method of claim 1, wherein the single-point Dixon technique is applied to first echo signal data or second echo signal data.

6. The method of claim 1, wherein the single-point Dixon technique is applied in two individual computation steps to first echo signal data and second echo signal data respectively, wherein the contributions from water and fat are computed by combining results of the two individual computation steps.

7. The method of claim 1, wherein the two echo signals are corrected for k-space misalignments prior to reconstructing the water and fat images.

8. The method of claim 1, wherein the two echo signals are corrected for phase errors and image space misalignments due to main field inhomogeneity prior to reconstructing the water and fat images.

9. The method of claim 1, wherein the first k-space region covers a central portion of k-space, while the second k-space region covers a peripheral portion of k-space.

10. The method of claim 1, wherein the first and second k-space regions are determined according to conditioning of inverse problems of the two-point and single-point Dixon techniques in the respective k-space regions.

11. The method of claim 1, wherein the contributions from water and fat are assumed to be Hermitian in k-space in those k-space regions in which an inverse problem of the respective two-point or single-point Dixon technique is ill-conditioned.

12. The method of claim 2, wherein the two echo signals are acquired using bipolar readout magnetic field gradients.

13. The method of claim 2, wherein the single-point Dixon technique is applied in two individual computation steps to first echo signal data and second echo signal data respectively, wherein the contributions from water and fat are computed by combining results of the two individual computation steps.

14. The method of claim 2, wherein the two echo signals are corrected for k-space misalignments prior to reconstructing the water and fat images.

15. The method of claim 2, wherein the two echo signals are corrected for phase errors and image space misalignments due to main field inhomogeneity prior to reconstructing the water and fat images.

16. The method of claim 2, wherein the two-point Dixon technique and/or the single-point Dixon technique are applied without regularization.

17. An MR device comprising at least one main magnet coil for generating a uniform, static magnetic field $B_0$ within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling temporal succession of RF pulses and switched magnetic field gradients, and a reconstruction unit for reconstructing MR images from the received MR signals, wherein the MR device is configured to perform the steps of the method of claim 1.

18. The tangible, non-statutory computer readable medium of claim 3, wherein the two echo signals are acquired using bipolar readout magnetic field gradients.

19. The tangible, non-transitory computer readable medium of claim 3, wherein the single-point Dixon technique is applied in two individual computation steps to first echo signal data and second echo signal data respectively, wherein the contributions from water and fat are computed by combining results of the two individual computation steps.

20. The tangible, non-statutory computer readable medium of claim 3, wherein the two echo signals are corrected for k-space misalignments prior to reconstructing the water and fat images.

21. The tangible, non-statutory computer readable medium of claim 3, wherein the two echo signals are corrected for phase errors and image space misalignments due to main field inhomogeneity prior to reconstructing the water and fat images.

22. The tangible, non-statutory computer readable medium of claim 3, wherein the first k-space region covers a central portion of k-space, while the second k-space region covers a peripheral portion of k-space.

* * * * *